US008411006B2

(12) United States Patent
Yanagi et al.

(10) Patent No.: US 8,411,006 B2
(45) Date of Patent: Apr. 2, 2013

(54) DISPLAY DEVICE INCLUDING SCAN SIGNAL LINE DRIVING CIRCUITS CONNECTED VIA SIGNAL WIRING

(75) Inventors: Toshihiro Yanagi, Nara (JP); Kazuhiro Tani, Toyonaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 922 days.

(21) Appl. No.: 12/091,972

(22) PCT Filed: Sep. 5, 2006

(86) PCT No.: PCT/JP2006/317530

§ 371 (c)(1),
(2), (4) Date: Jul. 23, 2009

(87) PCT Pub. No.: WO2007/052408

PCT Pub. Date: May 10, 2007

(65) Prior Publication Data

US 2009/0289884 A1 Nov. 26, 2009

(30) Foreign Application Priority Data

Nov. 4, 2005 (JP) ................................ 2005-320278

(51) Int. Cl.

| | |
|---|---|
| ***G09G 3/36*** | (2006.01) |
| ***G09G 3/20*** | (2006.01) |
| ***G09G 3/28*** | (2006.01) |
| ***G09G 5/00*** | (2006.01) |
| ***G06F 3/038*** | (2006.01) |
| ***H04N 5/21*** | (2006.01) |
| ***H04N 3/14*** | (2006.01) |
| ***G02F 1/133*** | (2006.01) |
| ***G02F 1/137*** | (2006.01) |
| ***G02F 1/1333*** | (2006.01) |
| ***H01L 23/58*** | (2006.01) |

(52) U.S. Cl. ................ 345/92; 345/55; 345/58; 345/60; 345/61; 345/87; 345/90; 345/94; 345/98; 345/99; 345/100; 345/204; 345/205; 345/208; 348/625; 348/626; 348/792; 349/33; 349/34; 349/35; 349/54; 257/629

(58) Field of Classification Search .................... 345/92
See application file for complete search history.

(56) References Cited

U.S. PATENT DOCUMENTS

| | | | |
|---|---|---|---|
| 4,917,470 | A | 4/1990 | Okada et al. |
| 4,955,697 | A | 9/1990 | Tsukada et al. |

(Continued)

FOREIGN PATENT DOCUMENTS

| | | | |
|---|---|---|---|
| CN | 1499272 | A | 5/2004 |
| EP | 0 574 920 | A2 | 12/1993 |

(Continued)

OTHER PUBLICATIONS

Chinese Office Action in Application No. 201010298227.0 dated May 25, 2011 with English Translation.

(Continued)

*Primary Examiner* — Alexander S Beck
*Assistant Examiner* — K. Kiyabu
(74) *Attorney, Agent, or Firm* — Nixon & Vanderhye P.C.

(57) ABSTRACT

In a display device having a plurality of scan signal line driving circuits, its display quality is improved. The display device comprises a plurality of scan signal lines, a plurality of image signal lines, and a plurality of scan signal line driving circuits for generating scan signals for driving the scan signal lines. Each of the scan signal line driving circuit internally generates a driving signal having the waveform of such potential variation that the potential decreases with a slope from a high potential to an intermediate potential between the high potential and a low potential. Each of the scan signal line driving circuits further includes a signal wiring for connecting the scan signal line driving circuits to one another and applying the driving signal.

8 Claims, 12 Drawing Sheets

U.S. PATENT DOCUMENTS

| | | | |
|---|---|---|---|
| 5,081,400 | A | 1/1992 | Weber et al. |
| 5,179,371 | A | 1/1993 | Yamazaki |
| 5,398,043 | A | 3/1995 | Takeda et al. |
| 5,408,226 | A | 4/1995 | Kwon |
| 5,587,722 | A | 12/1996 | Suzuki et al. |
| 5,657,037 | A | 8/1997 | Okada et al. |
| 5,714,968 | A | 2/1998 | Ikeda |
| 5,748,169 | A | 5/1998 | Okumura et al. |
| 5,754,155 | A | 5/1998 | Kubota et al. |
| 5,774,099 | A | 6/1998 | Iwasaki et al. |
| 5,777,591 | A | 7/1998 | Katoh et al. |
| 5,798,744 | A | 8/1998 | Tanaka et al. |
| 5,844,534 | A | 12/1998 | Okumura et al. |
| 5,896,117 | A | 4/1999 | Moon |
| 5,995,074 | A | 11/1999 | Kusafuka et al. |
| 5,995,075 | A | 11/1999 | Vignolle |
| 6,191,769 | B1 | 2/2001 | Fujiwara et al. |
| 6,225,992 | B1 | 5/2001 | Hsu et al. |
| 6,229,531 | B1 | 5/2001 | Nakajima et al. |
| 6,295,042 | B1 | 9/2001 | Aoki |
| 6,359,607 | B1 | 3/2002 | Yanagi et al. |
| 6,362,803 | B1 | 3/2002 | Tomomura et al. |
| 6,421,038 | B1 | 7/2002 | Lee |
| 6,867,760 | B2 | 3/2005 | Yanagi et al. |
| 7,027,024 | B2 | 4/2006 | Yanagi et al. |
| 7,304,626 | B2 | 12/2007 | Yanagi et al. |
| 2001/0033259 | A1 | 10/2001 | Sakaguchi |
| 2001/0033266 | A1 | 10/2001 | Lee |
| 2002/0000961 | A1 | 1/2002 | Kang |
| 2002/0057245 | A1 | 5/2002 | Yanagi et al. |
| 2004/0056331 | A1 | 3/2004 | Chen et al. |
| 2004/0085281 | A1 | 5/2004 | Chung et al. |
| 2006/0001640 | A1 | 1/2006 | Lee |
| 2008/0012813 | A1 | 1/2008 | Yanagi et al. |
| 2010/0194726 | A1 | 8/2010 | Yanagi et al. |

FOREIGN PATENT DOCUMENTS

| | | | |
|---|---|---|---|
| JP | 61-070430 | | 4/1986 |
| JP | 63-198022 | A | 8/1988 |
| JP | 1-320813 | A | 12/1989 |
| JP | 2-129618 | A | 5/1990 |
| JP | 2-272490 | A | 11/1990 |
| JP | 3-294822 | A | 12/1991 |
| JP | 4-265991 | A | 9/1992 |
| JP | 4-324418 | A | 11/1992 |
| JP | 4-324419 | A | 11/1992 |
| JP | 6-3647 | A | 1/1994 |
| JP | 6-43833 | A | 2/1994 |
| JP | 6-82828 | A | 3/1994 |
| JP | 6-110035 | A | 4/1994 |
| JP | 7-120720 | A | 5/1995 |
| JP | 9-258174 | A | 10/1997 |
| JP | 10-504911 | A | 5/1998 |
| JP | 11-281957 | A | 10/1999 |
| JP | 2000-137247 | A | 5/2000 |
| JP | 2001-125069 | A | 5/2001 |
| JP | 2001-281686 | A | 10/2001 |
| JP | 2005-031332 | A | 2/2005 |
| JP | 2006-330404 | A | 12/2006 |
| TW | 589598 | B | 6/2004 |

OTHER PUBLICATIONS

International Search Report for PCT/JP2006/317530, mailed Dec. 5, 2006.

Written Opinion and English translation thereof mailed Dec. 5, 2006 in corresponding PCT/JP2006/317530.

DISPLAY DEVICE INCLUDING SCAN SIGNAL LINE DRIVING CIRCUITS CONNECTED VIA SIGNAL WIRING

This application is the U.S. national phase of International Application No. PCT/JP2006/317530, filed 5 Sep. 2006, which designated the U.S. and claims priority to JP 2005-320278, filed 4 Nov. 2005, the entire contents of each of which are hereby incorporated by reference.

TECHNICAL FIELD

The present invention relates to display devices such as matrix type liquid crystal display devices and display methods, in particular, to a liquid crystal display device having such as a thin film transistor in each pixel as a switching element.

BACKGROUND ART

There has been known that liquid crystal display devices are widely used as a display element of such as televisions and graphic displays. Among them, a liquid crystal display device having a switching element such as a Thin Film Transistor (TFT hereinafter) in each pixel is particularly attracting attentions because it can provide high quality images without crosstalk among adjacent pixels, even if the number of pixel has been increased.

A main part of such a liquid crystal display device comprises a liquid crystal display panel 1001 and driving circuit section as shown in FIG. 7. In the liquid crystal panel, a liquid crystal layer is held between a pair of electrode substrates and polarizers are attached on each outer surface of the substrates.

One of the electrode substrates is a TFT-array substrate, which comprises a plurality of signal lines, S (1), S (2), . . . S (i), . . . S (N) and a plurality of scan signal lines, G (1), G (2), . . . G (j), . . . G (M) arranged in matrix formation on a transparent insulating substrate 1100 (made of glass or the like). At each intersection of a signal line and a scan signal line, there provided a switching element 1102 including a TFT, which is connected to a pixel electrode 1103. Then an alignment film covers over the substantially whole surface of the TFT-array substrate. In this way, the TFT-array is formed.

Another electrode substrate is a counter substrate, which comprises a counter electrode 1101 and an alignment film laminating in this order and covering over an entire surface of a transparent insulating substrate (made of glass or the like), similarly to the TFT-array substrate. The driving circuit section comprises a scan signal line driving circuit 1300 connected to every scan signal line aligned as explained above in the liquid crystal display panel, a signal line driving circuit 1200 connected to every signal line, and a counter electrode driving circuit COM connected to every counter electrode.

The scan signal line driving circuit (gate driver) 1300 comprises, as an example shown in FIG. 8, a shift register 1003*a* including cascade-connected an M number of flip-flops and selection switches 1003*b* each for turning ON and OFF in accordance with an output from the corresponding flip-flop.

An input terminal VD1 of each selection switch 1003*b* receives a potential Vgh for applying a gate ON voltage between source and gate. The gate ON voltage is sufficient for turning ON a TFT 1102. (referring FIG. 7) Another input terminal VD2 receives a potential Vgl for applying a gate OFF voltage between source and gate. The gate OFF voltage is sufficient for turning OFF the switch element 1102.

Accordingly, a data signal (GSP) is transmitted to flip-flops one after another and outputted to the selection switches 1003*b* respectively in accordance with a clock signal (GCK). In response to this, each selection switch 1003*b* outputs the potential Vgh for turning ON a TFT to a scan signal line 1105 for one selected scanning period, and then outputs the potential Vgl for turning off the TFT to the scan signal line 1105. As a result, the image signal supplied from the signal line driving circuit 1200 to each signal line 1104 (referring to FIG. 7) enables to write in each corresponding pixel.

FIG. 9 shows an equivalent circuit for one pixel P (i, j). The equivalent circuit includes a pixel capacitor C1*c* and an auxiliary capacitor Cs connected to a counter potential VCOM of the counter electrode driving circuit COM in parallel. In the FIG. 9, Cgd refers to a parasitic capacity between gate and drain in a TFT.

FIG. 10 is a waveform chart showing driving waveforms of a conventional liquid crystal display device. In the FIG. 10, Vg refers to a waveform of a scan signal line, Vs refers to a waveform of a signal line, and Vd refers to a drain wave.

The explanation of a conventional drive system is as follows with reference to FIG. 7, FIG. 9, and FIG. 10. It is widely known that liquid crystal display devices require an alternating current drive in order to prevent image deterioration and image sticking. The following explanation of a conventional drive system is also exemplified a frame inversion driving scheme, one kind of the alternating current drive schemes.

As shown in FIG. 10, when the electric potential Vgh is applied to a gate electrode g (i, j) of a TFT in one pixel P (i, j) from the scan signal line driving circuit 1300 in a first field (TF 1) (referring FIG. 7), the TFT turns ON. Then, an image signal voltage Vsp supplied from the signal line driving circuit 1200 is written in the pixel electrode through a source electrode and a drain electrode of the TFT. Then the pixel electrode preserves a pixel potential Vdp until the electric potential Vgh is applied in a second filed (TF 2). (referring FIG. 10) The counter electrode is set to a certain counter potential VCOM by the counter electrode driving circuit COM. Thus, the liquid crystal composition maintained in the pixel electrode and the counter electrode responds to a potential difference between the pixel potential Vdp and the counter potential VCOM, whereby an image is displayed.

In the same, when the electric potential Vgh is applied to the TFT gate electrode g (i, j) of the pixel P (i, j) from the scan signal line driving circuit 1300 in the second field (TF2) as shown in FIG. 10, the TFT turns ON. Then an image signal voltage Vsn supplied from the signal line driving circuit 1200 is written into a pixel electrode. Then, a pixel potential Vdn is maintained therein. The liquid crystal composition responds to a potential difference between the pixel potential Vdn and the counter potential VCOM, whereby, an image is displayed, and a liquid crystal alternating current drive is realized as well.

As shown in FIG. 9, a parasitic capacitor Cgd is naturally generated between the gate and drain of the TFT because of its structure. Therefore, when the potential Vgh drops, a level shift ΔVd occurs in a pixel potential Vd due to the parasitic capacitor Cgd. Where Vgl is a voltage when scanning signal is not scanned (a voltage when a TFT is OFF), a level shift ΔVd in a pixel potential Vd caused by a naturally generated parasitic capacitor Cgd is represented by the following formula:

$$\Delta Vd=Cgd(Vgh-Vgl)/(C1c+Cs+Cgd).$$

This causes problems in images on a display such as flickers and image deteriorations, which is not preferable at all for the liquid crystal display devices pursuing higher definition and quality.

A conventional art has been proposed, in which a counter potential VCOM of a counter electrode is biased to reduce the amount of level shift ΔVd caused by the parasitic capacitor Cgd in advance.

In the conventional art, however, it is difficult to dispose a plurality of scan signal lines G (1), G (2), . . . G (j), . . . G (M) on a transparent (such as made of glass) insulating substrate 100 (as shown in FIG. 7) in an ideal wiring free from signal propagation delay. Thus, in the conventional art, the scan signal lines G are signal delay paths that have a certain signal propagation delay.

FIG. 11 shows a propagation equivalent circuit, for explanation on the signal propagation delay in a scan signal line G (j). In FIG. 11, rg 1, rg 2, rg 3, . . . rg N represent resistor components mainly caused by materials, width, and length of a wiring composing the scan signal line. Also, cg 1, cg 2, cg 3, . . . cg N represent a variety of parasitic capacities in capacity coupling relationship with the scan signal line structurally, such as a cross capacity generated by crossing over signal lines. Therefore, the scan signal line is a signal propagation delay path of distribution constant type.

FIG. 12 shows how rounding of a scan signal VG (j) supplied from the scan signal line driving circuit 1300 to a scan signal line proceeds inside the panel due to the mentioned signal propagation delay characteristic. A waveform Vg (l, j) in FIG. 12 has little rounding because it is a waveform close to g (l, j) that is located right after the output from the scan signal line driving circuit 1300. However, also in FIG. 12, a waveform Vg (N, j) that is located close to the end of the signal line g (N, j) has rounding due to the signal propagation delay characteristic of the scan signal line. Because of the rounding, a variation per unit time SyN is generated.

In addition, TFT is not a perfect ON and OFF switch, and it has a V-I characteristic (gate voltage-drain current characteristic) as shown in FIG. 13. In FIG. 13, the horizontal axis of the graph refers to a voltage applied to a TFT gate, and the vertical axis of the graph refers to a drain current. Normally, a scanning pulse comprises two electric potentials, a potential Vgh enough to turn ON the TFT and a potential Vgl enough to turn OFF the TFT. As shown in FIG. 13, there is a transitional TFT ON region (linier region), in a midway between VT (threshold of TFT) and Vgh.

Therefore, as shown in FIG. 12, in the pixel at g (l, j), which is located right after the output from the scan signal line driving circuit 1300, the fall of the scan signal from Vgh to Vgl is so quick that the feature in the linear region has no effect. The level shift ΔVd (1) generated at the pixel potential Vd (l, j) due to the mentioned parasitic capacity Cgd is approximately:

$$\Delta Vd(1)=Cgd(Vgh-Vgl)/(C1c+Cs+Cgd)$$

However, at the pixel located close to the end of the scan signal line g (N, j), the fall of the scan signal has rounding. Therefore, during the transition from Vgh to around VT (threshold of TFT), the level shift caused by the parasitic capacitor Cgd does not occur in the pixel potential Vd because the TFT is ON due to the effect of the features in the linear region. During the transition from around VT (threshold of TFT) to Vgl, the level shift ΔVd (N) at the pixel potential Vd (N, j) occurs due to the parasitic capacitor Cgd. As a result, the level shift ΔVd (N) is:

$$\Delta Vd(N)<Cgd(Vgh-Vgl)/(C1c+Cs+Cgd)$$

Then, ΔVd (1)>ΔVd(N) is satisfied.

As explained above, the differentiation of the level shift ΔVd in the pixel potential Vd caused by the parasitic capacitor Cgd inside the panel is not uniform over the entire surface of the display and the differentiation is not ignorable in becoming higher definition and upsizing display. Accordingly, the conventional method of biasing the counter voltage leads to malfunctions such as flicker and image sticking caused by an application of DC component, because this method fails to cancel off the unevenness of the level shift over the entire surface of the display and drive each pixel in optimal alternating current.

As an invention to solve the malfunctions, there is a display device described in patent document 1. The explanation of the display device is as follows with reference to the accompanying drawings. FIG. 14 is a block diagram showing the structure of the scan signal line driving circuit 2001 of the display device. FIG. 15 (*a*) shows a waveform of a signal generated by the scan signal line driving circuit 2001 and FIG. 15 (*b*) shows a waveform of a signal supplied from the scan signal line driving circuit 2001.

As shown in FIG. 14, a plural of scan signal line driving circuits 2001 are disposed in one display device. The scan signal line driving circuit 2001 comprises an internal moderation section 2002 and a scan signal line driving section 2003.

The potential Vgh is applied to the internal modulation section 2002, then the internal modulation section 2002 modulates the potential Vgh and generates a driving signal VM having a waveform like reversed teeth of a saw as shown in FIG. 15 (*a*). The scan signal line driving section 2003 generates a scan signal VG shown in FIG. 15 (*b*) from the driving signal VM. The waveform of the scan signal VG rises vertically from the potential Vgl to the potential Vgh. After the potential Vgh for a certain period of time is maintained, the waveform of the scan signal VG falls with a linear slope, then fall substantially vertically to the potential Vgl. Because of the slope in the fall of the scan signal VG, the scan signal VG hardly has rounding. Then the effect of the characteristic in the linear region (shown in FIG. 13) is equalized between TFTs, one is located right after the output from the scan signal line driving circuit 1300 and another is located at the end of scan signal line. As a result, the level shift ΔVd generated in the pixel potential Vd due to the parasitic capacitor Cgd inside the panel is substantially equalized over the surface of the display.

Patent Document 1: Japanese Unexamined Patent Application (Translation of PCT Application) No. 10-504911

DISCLOSURE OF INVENTION

The display device, however, still has a problem that the waveforms of the obtained scan signal VG are not equalized. The detailed explanation is as follows with reference to the accompanying drawings. FIG. 16 shows the waveforms of VM1 to VM4 generated at the scan signal line driving circuits 2001-1 to 2001-4 in the conventional display device.

Recently, display devices have been developed in upsizing and high definition. In a large display device, all the scan signal lines are connected to one scan signal line driving circuit in order to control all the scan signal lines by one scan signal line driving circuit. In this case, there is a difference in retardation time between the scan signal lines, one is located close to the scan signal line driving circuit and another is located far from the scan signal line driving circuit. Such a retardation time negatively effects on the quality in display devices.

Additionally, there is a restriction in number of scan signal lines one scan signal line driving circuit can drive. Therefore, one signal line driving circuit is not able to drive all the scan signal lines in a high-definition display device with many scan signal lines.

Therefore, in FIG. 14, there are a plurality of scan signal line driving circuits 2001 to deal with the upsizing and higher-definition of the display. In specific, it is possible to increase the number of drivable scan signal lines and reduce the variations in distance between scan signal lines and scan signal line driving circuits by disposing a plurality of scan signal line driving circuits 2001.

A driving signal VM is generated in each internal modulation section 2002. The internal modulation section 2002 comprises electrical circuits such as a wiring, a transistor, and the like. Each electrical circuit is slightly different due to the different manufacturing process. Therefore the waveforms of the scan signal VM released from each internal modulation section 2002 varies in each internal modulation section 2002 as shown in FIG. 16. Same as above, the scan signal VG varies in each scan signal line driving circuit 2001. As explained above, the variation of the scan signal VG in each scan signal line driving circuit 2001 leads to a variation of TFT driving condition in each scan signal line driving circuit 2001. As a result, the quality of the liquid crystal display device is declined.

The purpose of this invention is to improve the display quality having a plurality of scan signal line driving circuits.

A first invention is directed to a display device comprising a plurality of scan signal lines, a plurality of image signal lines, a plurality of scan signal line driving circuits for generating scan signals for driving the scan signal lines, wherein: each scan signal line driving circuit internally generate a driving signal whose waveform changes in its such potential in such a manner that the potential decreases with a slope from a high potential to an intermediate potential between the high potential and a low potential and then increases from the intermediate potential to the high potential, the display device further comprises a signal wiring for connecting the scan signal line driving circuits with each other, the signal wiring having a potential equal to that of the driving signal.

A second invention is a dependent invention to the first invention and directed to the display device, wherein the driving signal has the waveform per cycle, the waveform changing in potential per cycle in such a manner that the potential decreases with a slope from the high potential to the intermediate potential between the high potential and a low potential and then increases from the intermediate potential to the high potential.

A third invention is a dependent invention to the second invention and directed to the display device wherein the scan signal line driving circuit receives a periodic signal having one pulse per the cycle.

A forth invention is a dependent invention to the third invention and directed to the display device, wherein the periodic signal is such that a length of a non-pulse period in one cycle is equal to a length of the slope from the high potential to the intermediate potential between the high potential and the low potential.

A fifth invention is a dependent invention to the third invention and is directed to the display device, wherein the periodic signal is fed into the scan signal line driving circuit in order to create potential decrease with the slope from the high potential to the intermediate potential between the high potential and a low potential.

A sixth invention is a dependent invention to the first through fifth inventions and directed to the display device wherein the potential change of the driving signal to decease the potential from the high potential to the intermediate potential with the slope partially slopes a potential change from a high potential to a low potential in the scan signals.

A seventh invention is a dependent invention to the first through sixth inventions is directed to the display device wherein the potential of the signal lines is an averaged potential of the driving signals generated by the scan signal line driving circuits.

An eighth invention is a dependent invention to the first through seventh inventions and is directed to the display device, wherein each scan signal line driving circuit comprising: a driving signal generation circuit for generating the driving signal according to a signal with the high potential; a scan signal generation circuit generating the scan signal according to the driving signal generated by the driving signal generation circuit; an internal wiring for transmitting the driving signal from the driving signal generation circuit to the scan signal generation circuit, each internal wiring being connected with one another by the signal lines.

[Effect of the Invention]

Because each scan signal line driving circuit is connected with the signal wiring, a potential of driving signal applied to the signal wiring becomes an averaged potential generated in every scan signal line driving circuit. Therefore, variations in potentials generated in scan signal line driving circuits are reduced. As a result, each scan signal line driving circuit can generate a less variation scan signal waveform among the scan signal line driving circuits, when it is generated based on a driving signal.

BRIEF DESCRIPTION OF DRAWINGS

FIG. 15 (*b*) is a waveform chart showing a waveform of a scan signal outputted from the scan signal line driving circuit 2001.

EXPLANATION OF REFERENCE NUMERALS

Figure 1:
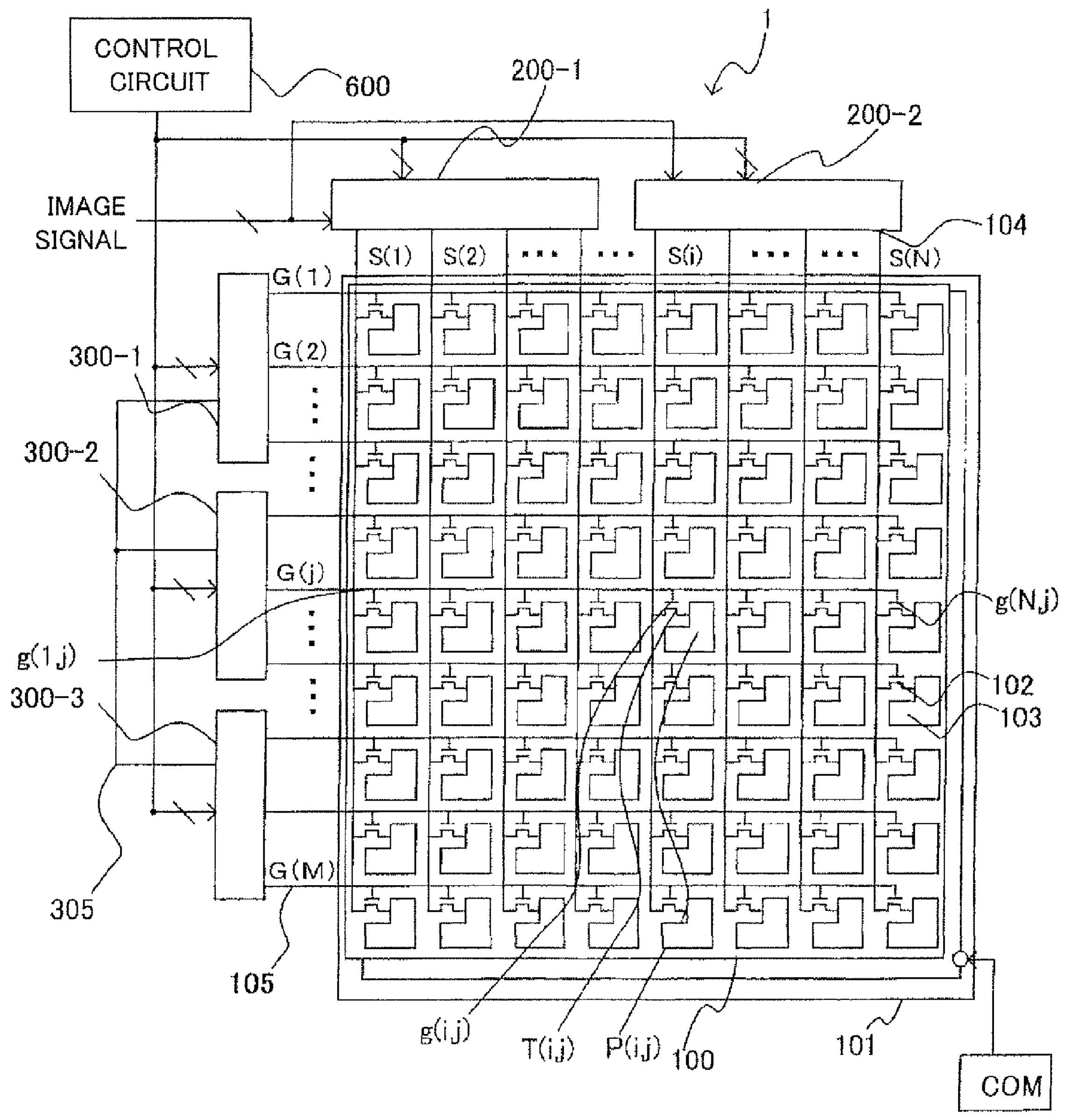
FIG. 1 is a block diagram showing an overall structure of the liquid crystal display device 1 as according to an embodiment of the present invention.

1 liquid crystal display device
100 insulating substrate
101 counter electrode
200 image signal line driving circuit
300 scan signal line driving circuit
305 signal wiring
310 internal modulation section (modulation section)
315 scan signal line driving section
600 control circuit
700 flexible print substrate
750 hard substrate
800 flexible print substrate
850 hard substrate
COM counter electrode driving circuit

BEST MODE FOR CARRYING OUT THE INVENTION

A display device according to one embodiment of the present invention is described below. The display device of the present invention comprises a plurality of scan signal lines extend in the row direction, a plurality of image signal lines extend in the column direction, a plurality of scan signal line driving circuits for generating scan signals for driving the scan signal lines. For the purpose of the display quality improvement in such a liquid crystal display device, in an embodiment of the display device of the present invention, each scan signal line driving circuit internally generates the waveform of such potential variation that the potential decreases with a slope from a high potential to an intermediate potential between the high potential and a low potential and then increases from the intermediate potential to the high potential and each scan signal line driving circuit is connected to one another with a signal wiring whose potential is equal to the potential of the driving signal.

As described above, because each scan signal line driving circuit is connected with the signal wiring, a potential of driving signal applied to the signal wiring becomes an average voltage generated in every scan signal line driving circuit. Therefore, variations in potentials generated in scan signal line driving circuits are reduced. As a result, each scan signal line driving circuit can generate a scan signal waveform with less variation among the scan signal line driving circuits, when it is generated based on a driving signal.

[Structure of the Display Device]

The display device according to the present embodiment of the present invention is described in detail as follows with reference to the accompanying drawings. FIG. 1 shows an overall structure of a liquid crystal display device 1. The liquid crystal display device 1 is a display device with a flame inversion drive, comprises an insulating substrate 100, a counter electrode 101, image signal line driving circuits 200-1 and 2001-2, scan signal line driving circuits 300-1 to 300-3, a signal wiring 305, a control circuit 600, a counter electrode circuit COM. The other inversion drives are also available for the liquid crystal device 1.

The Insulating substrate 100 is an active matrix substrate comprising a glass substrate, and on a main surface thereof, image signal lines S (1) to S (N), scan signal lines G (1) to G (M), and a display pixel P (i, j) (i is an integral number from 1 to N, j is an integral number from 1 to M). The image signal lines S (1) to S (N) are extended in the column direction. By the image signal line driving circuit 200-1 or 200-2, image signals whose voltage is dependent on an image contents are applied on the image signal lines S (1) to S (N). The scan signal lines G (1) to G (M) are extended in the row direction. Scan signals are applied on the scan signal lines G (1) to G by the scan signal line driving circuits 300-1 to 300-3. An image signal line on line i is called a image signal line s (i) (i is an integral number from 1 to N). An image signal line in general is called an image signal line s. Also, a scan signal line on line j is called a scan signal line G (j) (j is an integral number from 1 to M). A scan signal line in general is called a scan signal line G. Same as above, a pixel at an intersection of line i and column j is called a P (i, j) (i is an integral number from 1 to N, j is an integral number from 1 to M). A pixel in general is called a pixel P.

The pixel P (i, j) is located near the intersection of an image signal line S (i) and a scan signal line G (j). Accordingly, the pixels P are located on the surface of the insulating substrate 100 in matrix formation. The pixel P (i, j) includes a transistor (TFT) 102 and a pixel electrode 103. The transistor 102 located near the intersection of the image signal line S (i) and the scan signal line G (j) designates a T (i, j) hereinafter. A source of the transistor T (i, j) is connected to the corresponding image signal line S (i), and a gate of the transistor T (i, j) is connected to the corresponding scan signal line G (j). The pixel electrode 103 is connected to a drain of the transistor 102.

A counter electrode 101 is disposed on a substantially whole surface of an unillustrated counter substrate and is applied a counter voltage having a certain potential from the counter electrode driving circuit COM. Between the counter electrode 101 and the pixel electrode 103, there is a layer of liquid crystal. The liquid crystal changes the transmissivity depending on the potential difference between the counter electrode 101 and the pixel electrode 103. In order to adjust a pixel P to required transmissivity, the image signal having a potential corresponding to the required transmissivity should be applied to an image signal line S and the scan signal enough to conduct a transistor T should be applied to a scan signal line G. As a result, the pixel electrode 103 is charged up to a required potential through the transistor T, then the pixel P is controlled to required transmissivity.

Figure 2:
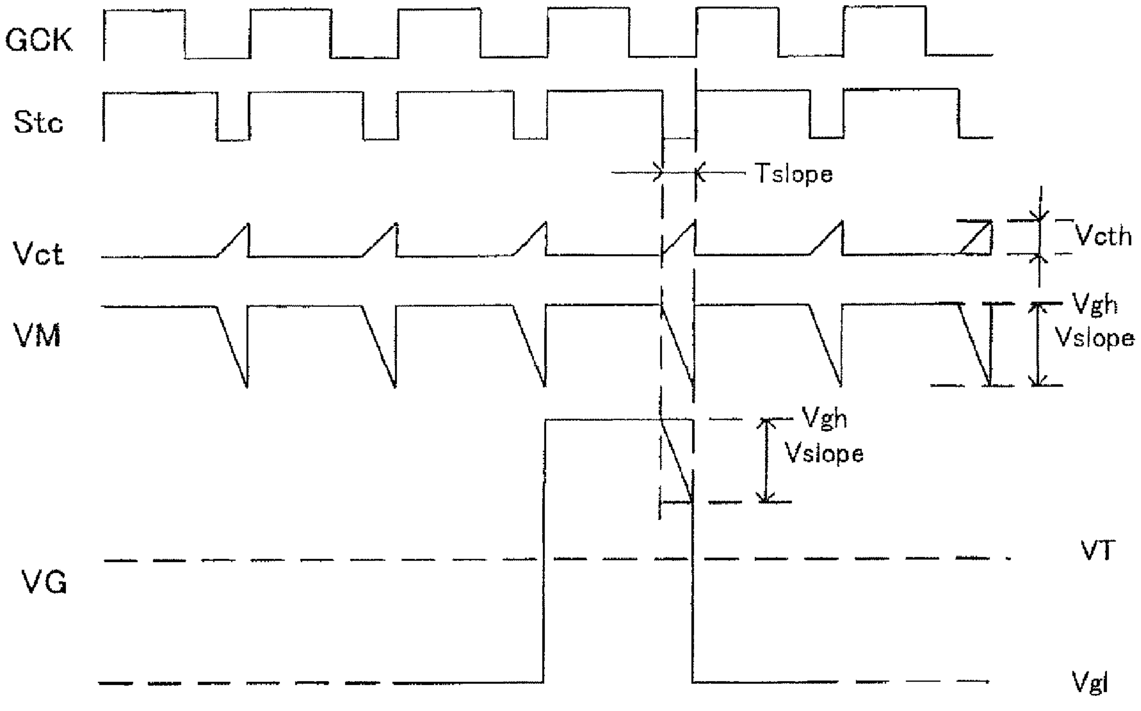
FIG. 2 is a waveform chart showing a clock signal (GCK), a periodic signal (Stc), a middle signal (Vct), a drive signal (VM), and a scan signal (VG).

The control circuit 600 generates a clock signal (GCK) and a periodic signal Stc to activate the image signal line driving circuits 200-1 and 200-2 and the scan signal line driving circuits 300-1 to 300-3 as shown in FIG. 2. FIG. 2 shows waveforms of the clock signal (GCK), the periodic signal (Stc), a middle signal (Vct), a driving signal (VM), and a scan signal (VG). The details of the waveforms of the clock signal (GCK), periodical signal (Stc), and scan signal (VG) will be explained later.

The image signal line driving circuits 200-1 and 200-2 apply a received image signal to an image signal line S by using the clock signal (GCK). The scan signal line driving circuits 300-1 to 300-3 generate a scan signal (VG) as shown in FIG. 2 by using a clock signal (GCK) and a periodical signal (Stc) and apply it to a scan signal line G. The following is the detailed explanation of the scan signal line driving circuits 300-1 to 3001-3 with reference to the accompanying drawings.

[Structure of the Scan Signal Line Driving Circuit]

Figure 3:
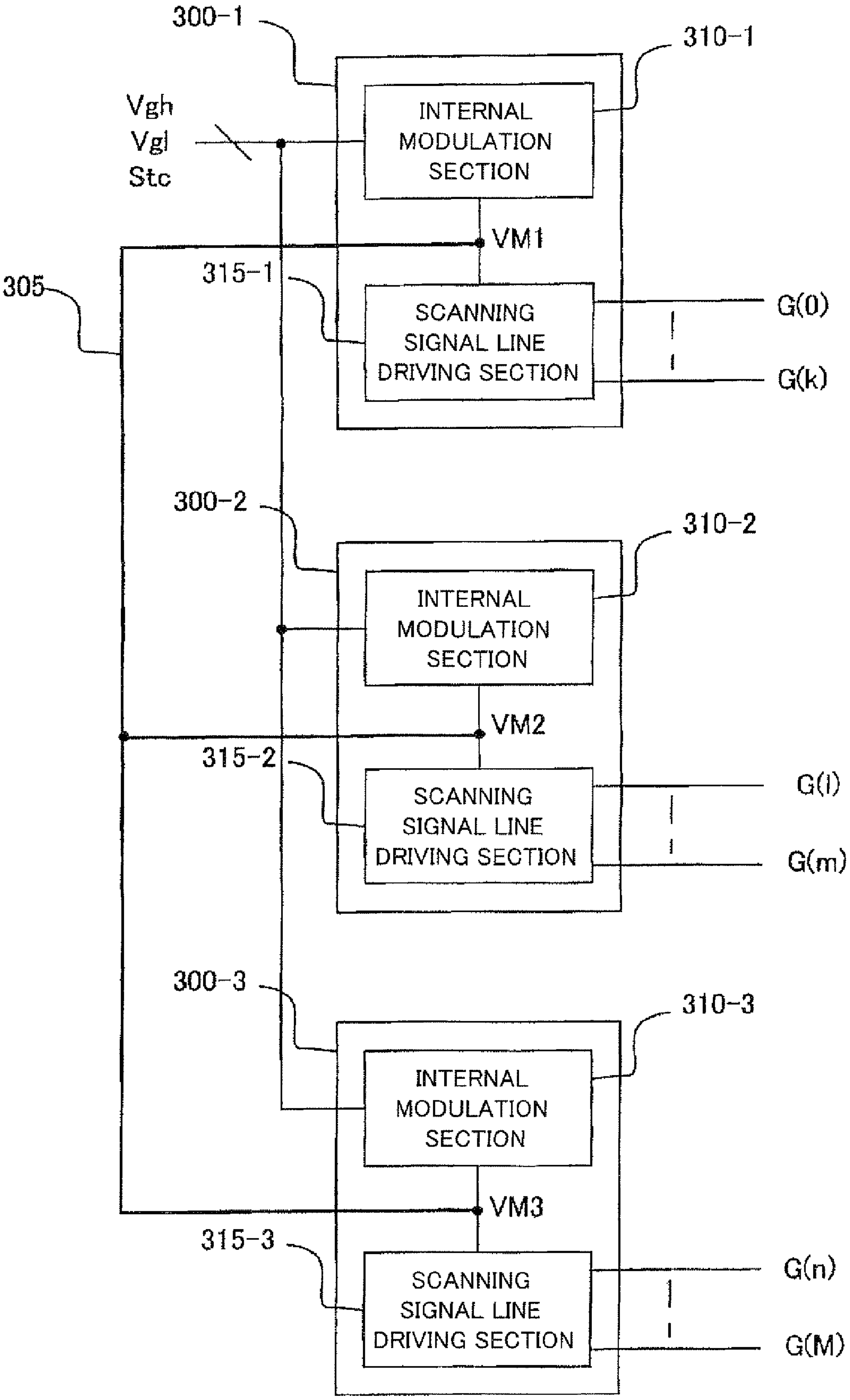
FIG. 3 is a block diagram showing a structure of scan signal line driving circuits 300-1 to 300-3.

FIG. 3 is a block diagram showing the structure of the scan signal line driving circuits 300-1 to 300-3. The following explanation is focused on the scan signal line driving circuit 300-1.

The scan signal line driving circuit 300-1 includes an internal modulation section 310-1 and a scan signal line driving section 315-1. The internal modulation section 310-1 generates a middle signal Vct (shown in FIG. 2) based on a potential Vgl and a periodical signal Stc, then generates a driving signal VM1 (shown in FIG. 2) based on a middle signal Vct and a high potential Vgh. A driving signal VM1 refers to a driving signal VM generated by the internal modulation section 310-1. A driving signal VM2 refers to a driving signal VM generated by the internal modulation section 310-2. A driving signal VM3 refers to a driving signal VM generated by the internal modulation section 310-3. Also, a potential Vgl refers to a potential enough to generate the gate OFF voltage between the source and gate for controlling the transistor 102 in the nonconducting state when it is applied to the gate of the transistor 102. In this case, ground potential is adopted as an example. The scan signal line driving section 315-1 generates a scan signal VG (shown in FIG. 2) based on a driving signal VM1 generated by the internal modulation section 310-1.

Figure 4:
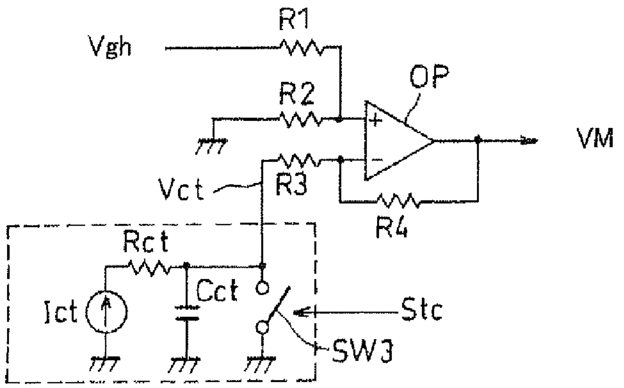
FIG. 4 is a circuit diagram showing a structure of internal modulation section 310-1.

FIG. 4 is a circuit diagram showing the structure of the internal modulation section 310-1. The internal modulation section 310-1 comprises resistors R1, R2, R3, Rct, an operation amplifier OP, a capacitor Cct, a constant current source Ict, and a switch SW3.

A periodical signal Stc is a slope period control signal (charge/discharge control signal) to create a slope in a scan signal VG shown in FIG. 2 and controls opening and closing of a switch SW3 connected to a capacitor Cct in parallel. The periodical signal Stc has a waveform having one high level pulse for a certain period of time per cycle. During the pulse period in which the periodical signal Stc is at the high level, the switch SW3 is controlled to close. During the non-pulse period in which the periodical signal Stc is at low level, the switch SW3 is controlled to open.

The constant current source Ict is coupled with one terminal of the capacitor Cct through the resistor Rct, and the other terminal of the capacitor Cct is grounded. The middle signal Vct, the voltage of both terminals of the capacitor Cct, is applied to the inverting input terminal of the operation amplifier OP through the resistor R3. The resistor R4 is connected between the inverting input terminal and the output terminal of this operation amplifier OP.

The periodical signal Stc should be synchronized with the clock signal GCK as shown in FIG. 2. For instance, the periodical signal Stc may be generated by the control circuit 600 by using such a mono-multi-vibrator (not illustrated). As an alternative the periodical signal Stc may be generated inside the scan signal line driving circuit 300-1. The switch SW3 is closed during the period in which the periodical signal Stc is at the high level, and the switch SW3 is opened during the period in which the periodical signal Stc is at the low level.

The noninverting input terminals of the operation amplifier OP are connected to one terminal of the resistors R2 and R1 respectively. The other terminal of the resistor R2 is grounded and a potential Vgh is applied to the other terminal of the resistor R1. The signal potential Vgh is a potential enough to generate the gate ON voltage between the drain and source of the TFT for turning ON the TFT. The operation amplifier outputs a driving signal VM from its output terminal. As explained above, the slopes of both the driving signal VM and the middle signal Vct are generated in accordance with a low level periodical signal Stc. Therefore, the length of the slopes of the driving signal VM and the middle signal Vct, and the length of the low portion of the potential periodical signal Stc (the length of the non-pulse period) are all equal.

In addition, the operation amplifier OP, and the resistors R1, R2, R3, and R4 are arranged for the subtraction element. In this subtraction element, the following subtraction process is conducted.

$$VM=Vgh(R2/(R1+R2))(1+(R4/R3))-(R4/R3)Vct$$

If $R1=R4$, $R2=R3$, and $A=R4/R3$, $$VM=Vgh-A/Vct$$

Figure 5:
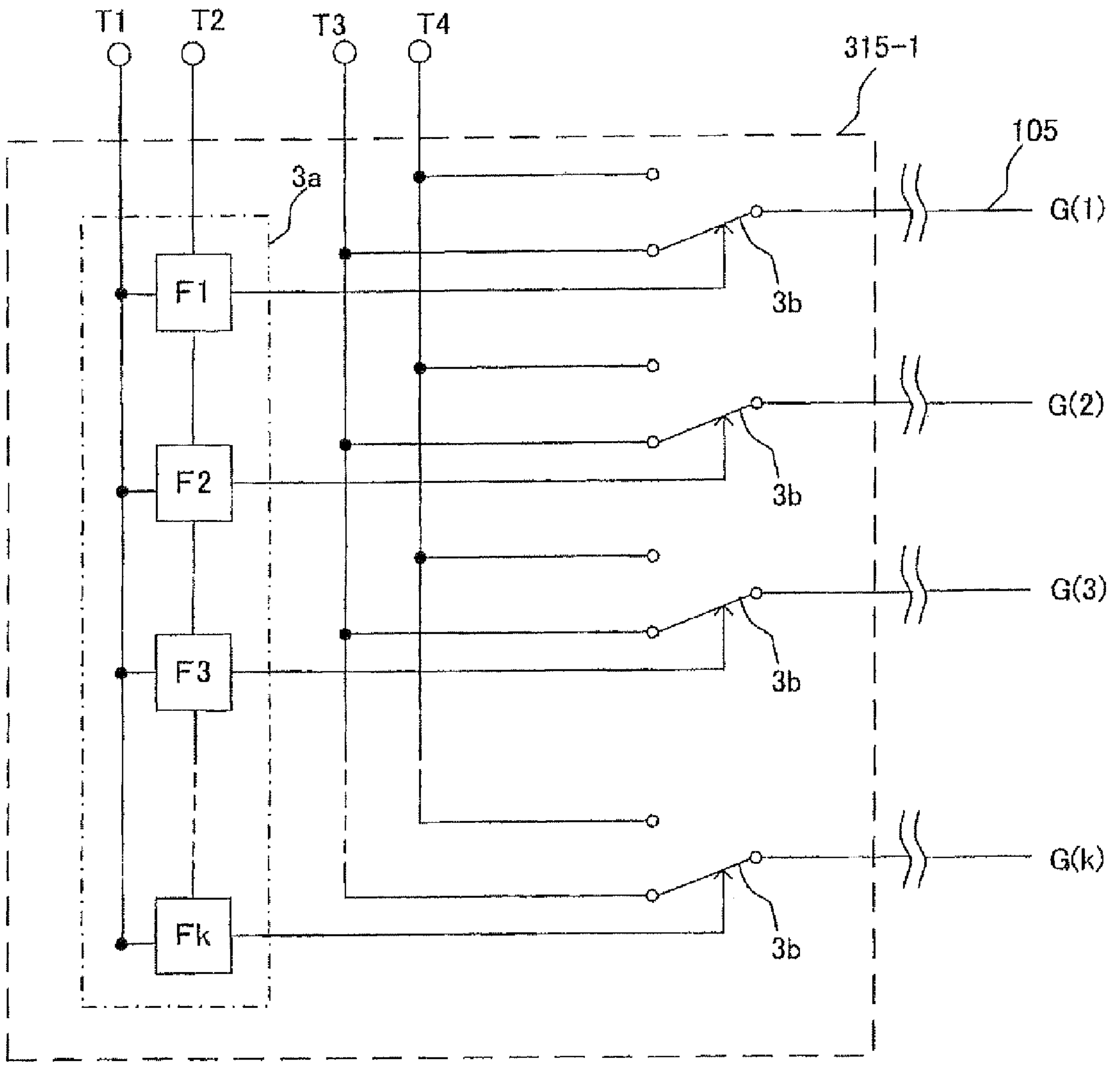
FIG. 5 is a block diagram showing a structure of scan signal line driving section 315-1.

FIG. 5 shows a structure of the scan signal line driving section 315-1. The scan signal line driving section 315-1 includes a shift resister 3*a*, a selection switch 3*b*, and terminals T1 to T4.

The clock signal GCK is applied to the terminal T1. The data signal GSP is applied to the terminal T2. To the terminal T3, applied is the potential Vgl enough to generate the gate OFF voltage between the source and gate of the transistor 102 for turning the transistor 102 off when the gate OFF voltage is applied to the gate of the transistor 102. The driving signal VM1 is applied to the terminal T4. The shift resistor 3*a* comprises k stages of flip-flops F1 to Fk corresponding to the number of scan signal lines G. Each of the flip-flops F1 to Fk-1 transmits a data signal GSP to its next flip-flop (the flip-flop F2 to Fk) in accordance with the clock signal GCK and every flip-flop F1 to Fk outputs a sampling pulse to a corresponding selection switch 3*b* when every flip-flop F1 to Fk transmits the data signal GSP. Namely, along with the data signal GSP transmission, the sampling pulses are released to the selection switches 3*b* sequentially from upstream to downstream. A general term of flip-flop F1 to Fk is a flip-flop F.

The selection switches 3*b* are provided in pair with the scan signal lines G, numerically. The selection switch 3*b* outputs one of the two inputs according to the sampling pulse. The driving signal VM1 and the potential Vgl are applied to the two input terminals of the selection switch 3*b* respectively. For an output terminal of each selection switch 3*b*, the signal line G is connected. The selection switch 3*b* selects the driving signal VM1 in reception of the input of the sample pulse and selects the potential Vgl in reception of no input of the sample pulse. As a result, the waveform of the scan signal VG having one cycle of the driving signal VM1 is formed as shown in FIG. 2. To be more specific, the waveform of the scan signal VG rises up vertically from the potential Vgl to the potential Vgh. Then, the potential Vgh is maintained for a certain period of time. After that, and the scan signal VG falls with a linear slope, then falls substantially vertically to the potential Vgl. It is preferable that the potential at the end of the slope of the scan signal VG is higher than the potential VT that is enough to generate a threshold voltage for conducting transistor 102.

[Structure of the Signal Wiring]

Here is the explanation of the signal wiring 305. In the display device 1 of the present invention, the signal wiring 305 connects to scan signal line driving circuits 300-1 to 300-3 one another as shown in FIG. 1 and is applied a driving signal VM. To be more specific, as shown in FIG. 3, the internal wiring between the internal modulation section 310-1 and the scan signal line driving section 315-1, the one between the internal modulation section 310-2 and the scan signal line driving section 315-2, and the one between the internal modulation section 310-3 and the scan signal line driving section 315-3 are all connected together with the signal wiring 305. As a result, the waveforms of the driving signals VM1 to VM3 applied to each internal wring are equalized.

[The Operation of the Liquid Crystal Display Device]

The operation of the liquid crystal display device of the present invention is explained hereinafter with reference to the accompanying drawings. The following explanation is focused on the operations of the scan signal line driving circuits 300-1 to 300-3.

As shown in FIG. 2, the selection switch SW3 is opened during the period in which the periodical signal Stc is at the low level (shown in FIG. 4). Thereby, an electrical charge is charged from the constant current source Ict to the capacitor Cct through the resistor Rct. Therefore, the potential of the middle signal Vct increases with a slope during the periodical signal Stc is at the low level as shown in FIG. 2.

At the same time, in the subtraction element, a potential of the middle signal Vct multiplied by A (=R4/R3) is subtracted from the potential Vgh, which creates a waveform of a declining slope from Vgh to a middle point between Vgh and Vgl (grounded potential). Also, it is possible to decrease the driving signal VM with a Vslope at any incline by altering the value of A.

On the contrary, the selection switch SW3 is closed during the period in which the periodical signal Stc is at the high level and a charge in the capacitor Cct is released through the selection switch SW3. As a result, the potential of the middle signal Vct is lowered to the ground potential as shown in FIG. 2. At this time, in the subtraction element, a potential of the middle signal Vct multiplied by A (=R4/R3) is subtracted from the potential Vgh. However, since the potential of the middle signal Vct is grounded, the potential Vgh is outputted as the driving signal VM as shown in FIG. 2.

As described above, the middle signal Vct has a waveform like teeth of a saw with maximum amplitude Vcth according to the control of the periodical signal Stc. In specific, the middle signal Vct has such a waveform that the potential increases during the non-pulse period, and is grounded during the pulse period. Then the driving signal VM shows a waveform like teeth of a reversed saw. To be more specific, the driving signal VM has such a waveform per cycle that the potential decreases with a slope from a high level potential to a intermediate voltage between the high potential and a low potential and then increases from the intermediate potential to the a high potential. The beginning of the slope of the driving signal VM and that of the middle signal Vct are coincident and the end of the slope of the driving signal VM and that of Vct are also coincident. The waveform of the driving signal VM has a slope period Tslope and a gradient Vslope and the following formula is satisfied. Vslople=Vcth (R4/R3) Vslope is easy to control by adjusting R4 and R3. Also, an impedance of output signal VD1*b* becomes lower due to the output from an operation amplifier OP. (The impedance of the operation amplifier OP is lower compared to the next stage)

Each internal modulation section (modulation section) 310-1 to 310-3 outputs the generated driving signal VM 1 to VM3 to each corresponding scan signal line driving section 315-1 to 315-3 through the internal wiring shown in FIG. 3. Since every internal wiring is connected with the signal wiring 305, the waveforms VM1 to VM 3 are equalized. This means that the scan signal line driving circuit 315-1 to 315-3 respectively receive the driving signals VM1 to VM 3 having a substantially identical waveform. In reception of the driving signals VM1 to VM 3, the scan signal driving sections 315-1 to 315-3 respectively generate scan signals G based on the driving signals VM1 to VM3. In practical, in the shift resister 3*a* shown in FIG. 5, each flip-flop F transmits the data signal GSP to the one in the next stage and repeats this transmission according to the clock signal GCK. In response to the data signal GSP transmission, the flip-flop F outputs the sampling pulse to the selection switch 3*b*.

The selection switch 3*b* with no sampling pulse application selects the potential Vgl and outputs the potential Vgl to the scan signal line G. However, the selection switch 3*b* with a sampling pulse application selects the driving signal VM and outputs the driving signal VM to the scan signal line G. As a result, the scan signal VG as shown in FIG. 2 is applied in the scan signal line G.

Figure 13:
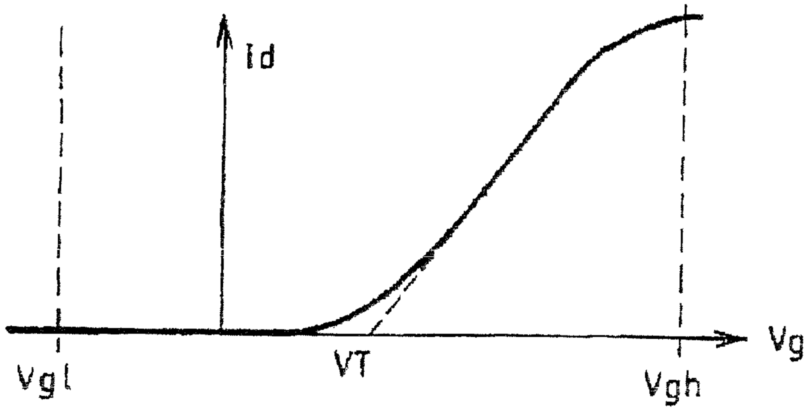
FIG. 13 (Prior Art)
FIG. 13 is a graph showing characteristics of a transistor.
Figure 14:
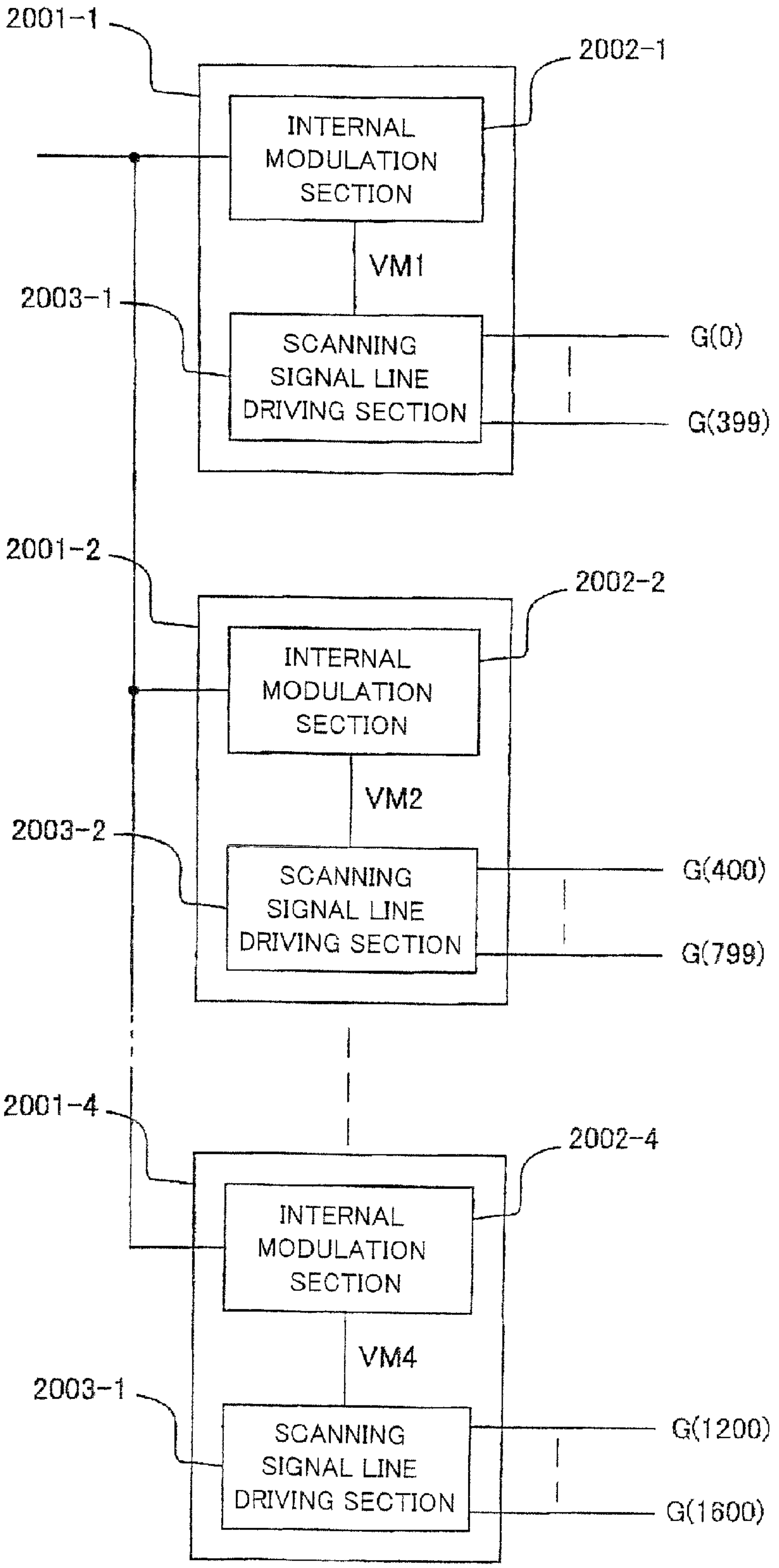
FIG. 14 (Prior Art)
FIG. 14 is a block diagram showing a structure of a scan signal line driving circuit 2001 of a conventional display device.
Figure 15A:
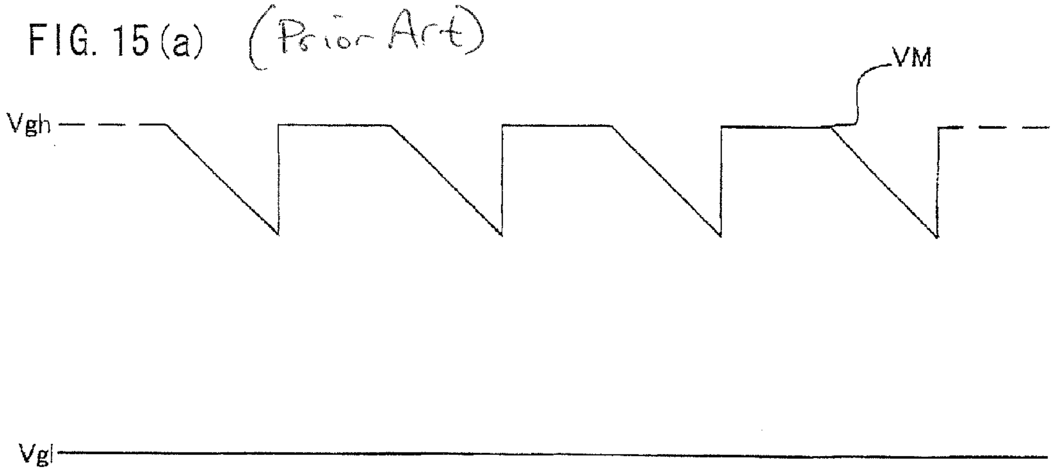
FIG. 15(a) (Prior Art)
FIG. 15 (*a*) is a waveform chart showing a waveform of a signal generated by the scan signal line driving circuit 2001.
Figure 15B:
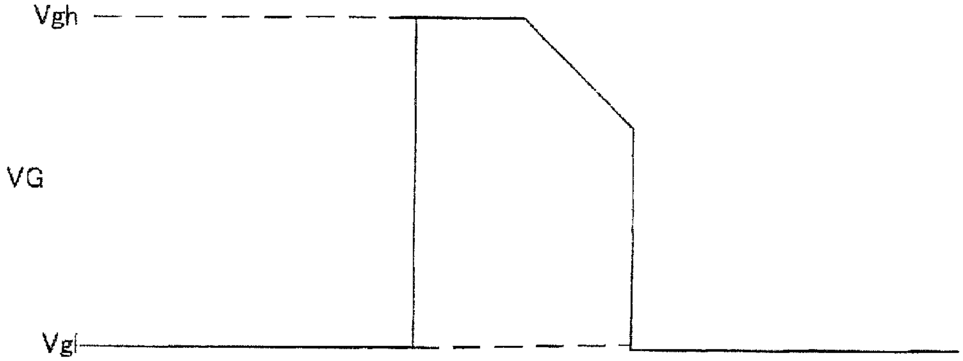
FIG. 15(b) (Prior Art)
Figure 16:
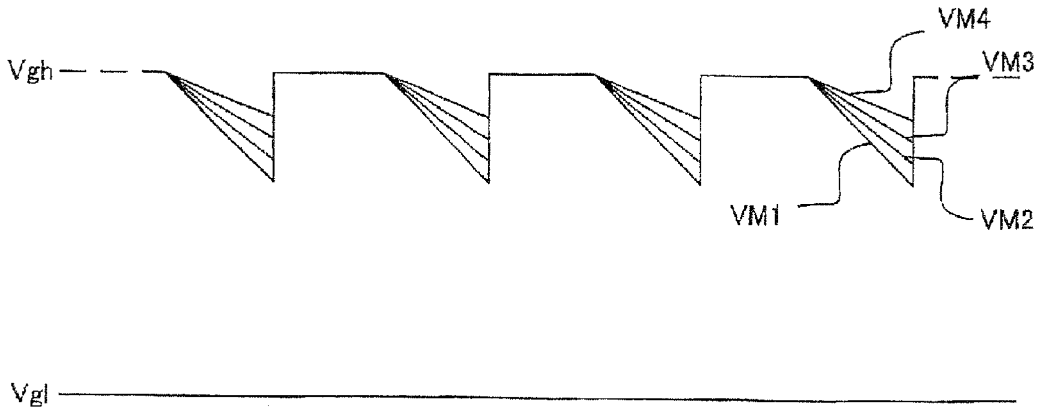
FIG. 16 (Prior Art)
FIG. 16 is a waveform chart showing a waveform of driving signals VM1 to VM4 generated by a scan signal line driving circuit 2001-1 to 2001-4 in a conventional display device.

As described above, according to the liquid crystal display device in the present invention, the scan signal VG decreases not vertically but with a slope, which makes the last transition of the scan signal VG hard to have rounding. Then the effect of the characteristics in the linear region (shown in FIG. 13) is substantially equalized between TFTs, one is located right after the output from the scan signal line driving circuit 1300 and another is located at the end of the scan signal line. As a result, a level shift ΔVd occurring in a pixel potential Vd due to a parasitic capacitor Cgd inside the panel becomes close to uniform on the surface of the display panel, which leads to solve the unevenness of the display quality between right side and lift side of the display area in a liquid crystal display device.

In addition, since the internal wiring of the scan signal line driving circuits 300-1 to 300-3 are connected to one another with the signal wiring 305, the waveforms VM1 to VM 3 applied to the internal wirings are equalized. In practical, a slope in the waveform of each driving signal VM1 to VM3 becomes substantially uniform. The scan signal drivers 315-1 to 315-3 respectively generate scan signals VG according to the driving signals VM1 to VM3. Therefore, when the slope of each driving signal VM1 to VM3 is substantially uniform, the slope of the scan signal VG is also substantially uniform. This solves the problem of the quality imbalance of the display among the areas corresponding to the scan signal line driving circuits 300-1 to 300-3.

The quality imbalance among the areas corresponding to each scan signal line driving circuits 300-1 to 300-3 is caused because each driving signal VM1 to VM3 is individually generated by each internal modulation section 310-1 to 310-3 inside the each scan signal line driving circuit 300-1 to 300-3. This means that the same kind of problem occurs even if the waveforms of the driving signal VM1 to VM3 is different from the one explained in the embodiment of the present invention. This kind of problem is also solved by connecting the internal wiring of the scan signal driving circuits 300-1 to 300-3 with the signal wiring 305 and equalizing the waveform of the driving signals VM1 to VM3 applied to the internal wiring.

In the liquid crystal display device of the present invention, the pulse waveform of the scan signal G is generated by using one cycle of the driving signal VM cut out by the sampling pulse supplied from the shift resister 3*a*. However the usage of the driving signal VM is not limited to this. It is essential that a slope of the driving signal VM is used for the generation of the slope of the scan signal G.

In the liquid crystal display device of the present invention, both the driving signal VM and the scan signal VG decrease with a straight slope, however, the slope of the driving signal VM and the scan signal VG is not always a straight line. The slopes should be nearly straight. Its tolerance is about the extent of the delay in generation of the driving signal VM and the scan signal VG.

Embodiments of the liquid crystal display device of the present invention are, for example, small liquid crystal display devices such as a cellular phone and a Personal Digital Assistance (PDA), and large liquid crystal display devices such as a television, and a monitor of a personal computer. However, the liquid crystal display device of the present invention is suitable for a large liquid crystal display device such as a television and a monitor of a personal computer, because the large liquid crystal display has a longer scan signal line G, a larger rounding in the waveform of the scan signal VG at both ends, and a larger influence of the level shift ΔVd variation caused by the rounding to the display quality, compared to a small liquid crystal display device.

[Implementation Example]

Figure 6:
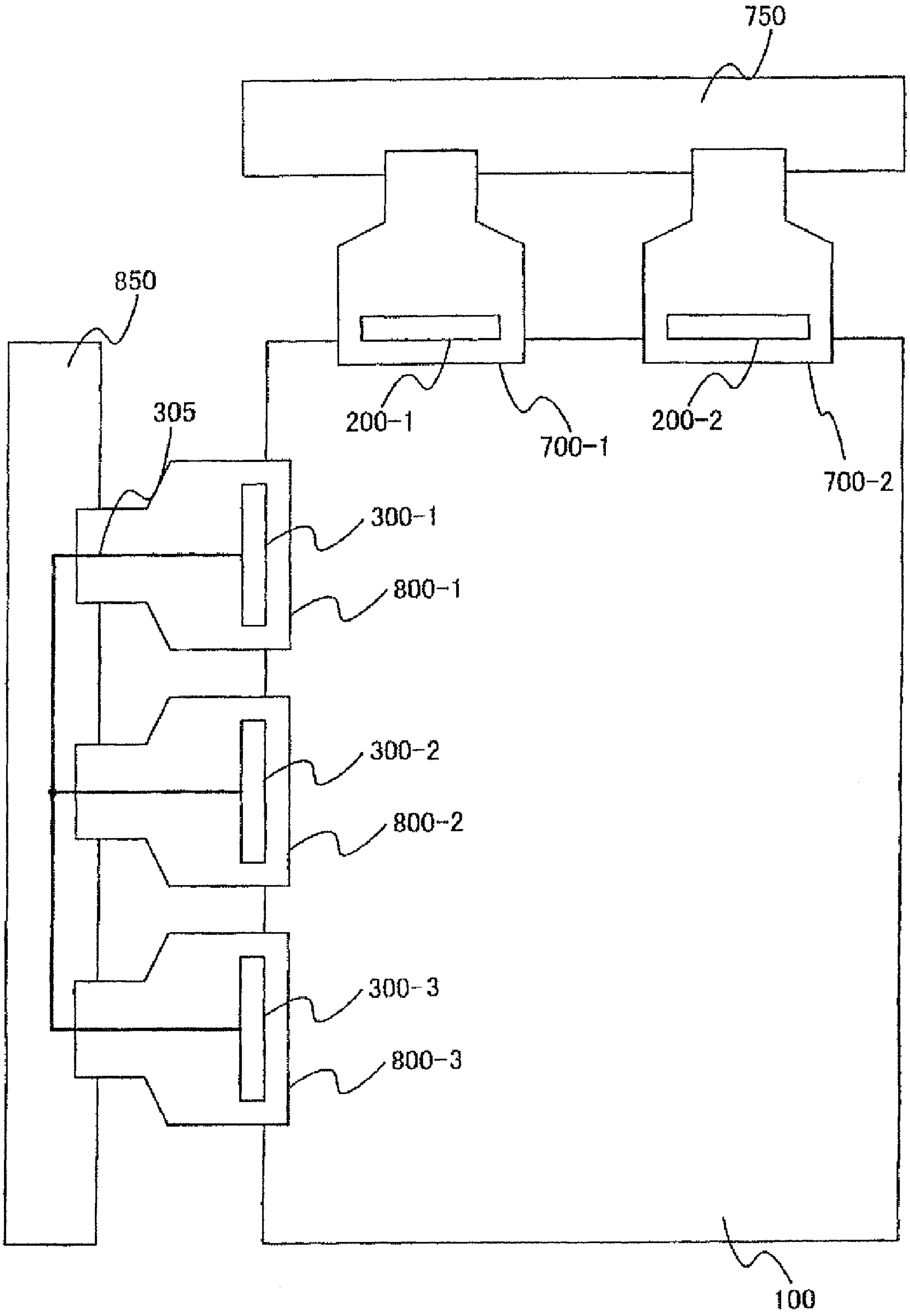
FIG. 6 is an exemplary plain view of an insulating substrate 100 implemented an image signal line driving circuit 200 and a scan signal line driving circuit 300.
Figure 7:
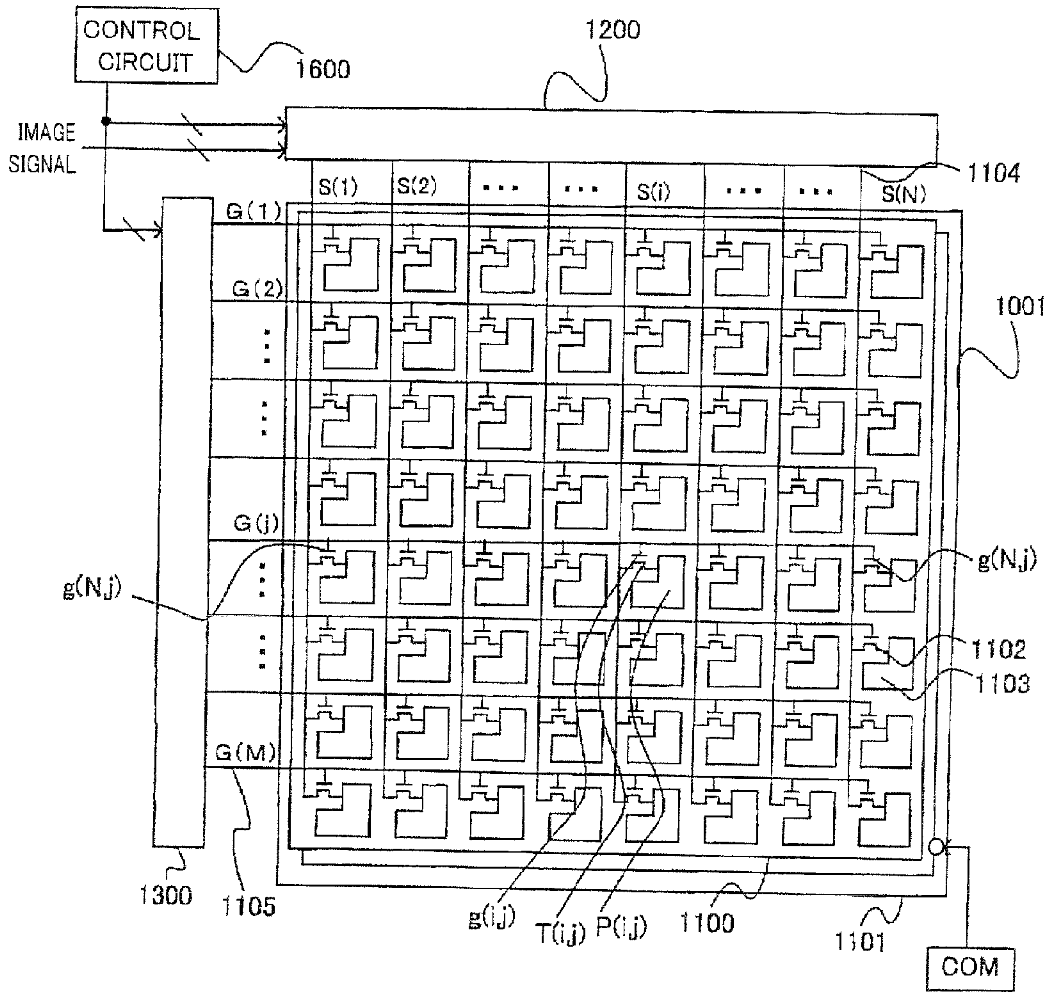
FIG. 7 (Prior Art)
FIG. 7 is a block diagram showing an entire structure of a conventional liquid crystal display device.
Figure 8:
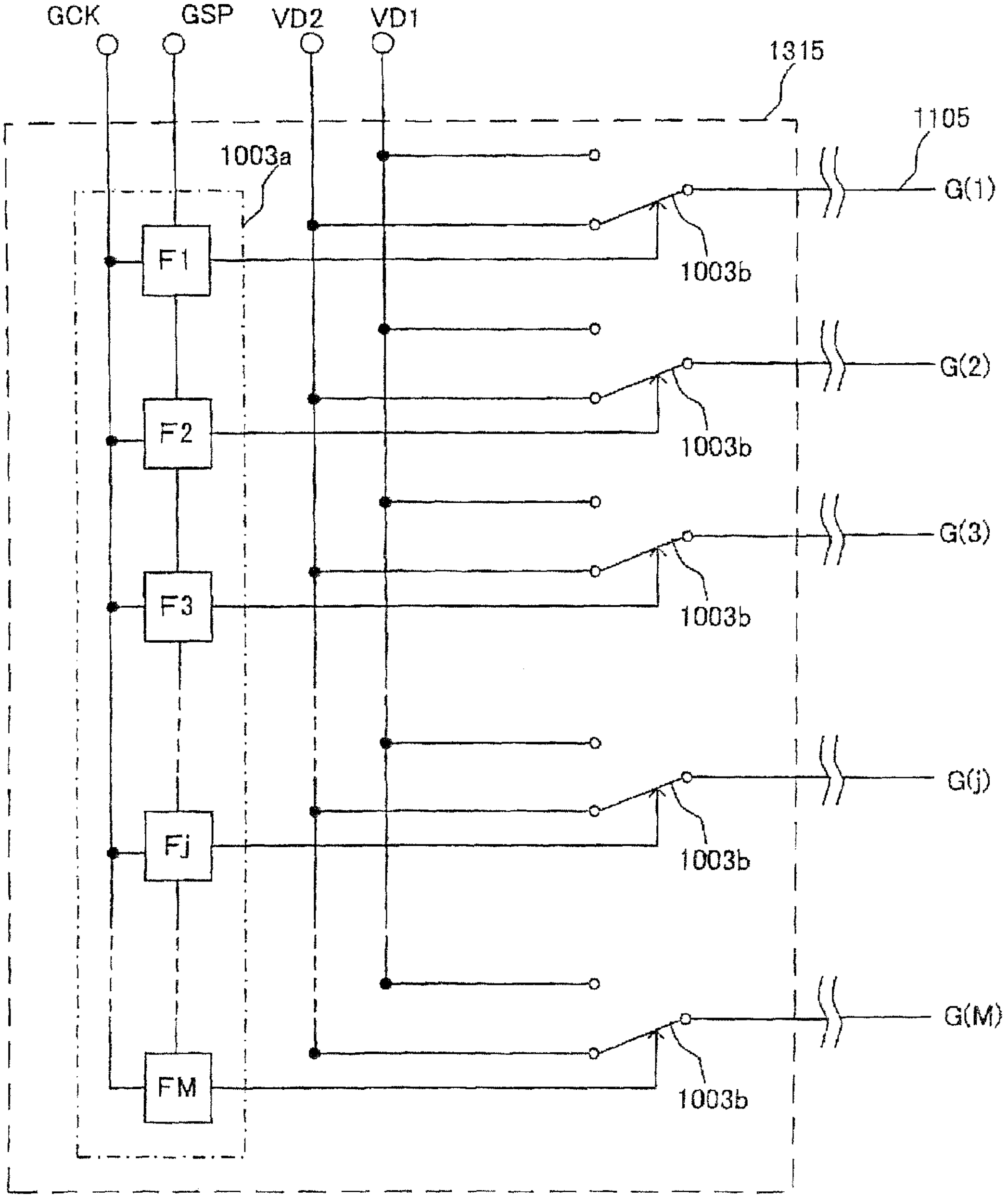
FIG. 8 (Prior Art)
FIG. 8 is a block diagram showing a structure of a conventional scan signal line driving section 1315.
Figure 9:
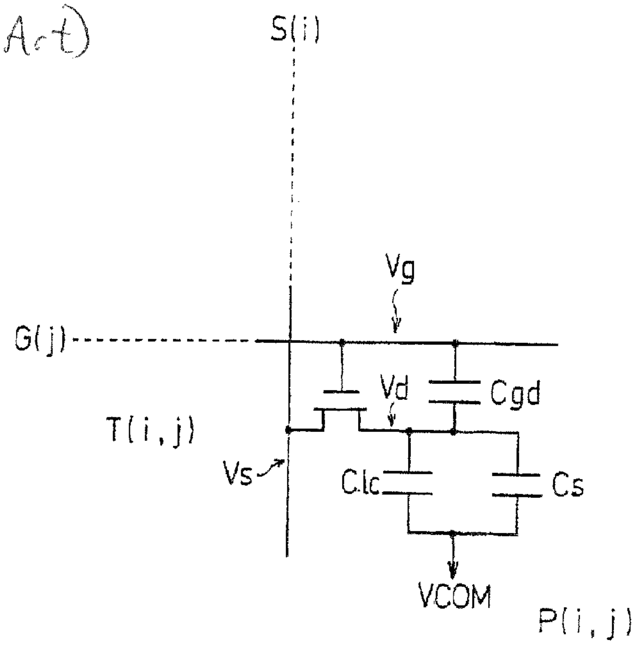
FIG. 9 (Prior Art)
FIG. 9 is a circuit diagram of an equivalent circuit in one pixel P (i, j) showing that a pixel capacitor C1*c* and an auxiliary capacitor Cs are connected to an counter potential VCOM of a counter electrode driving circuit COM in parallel.
Figure 10:
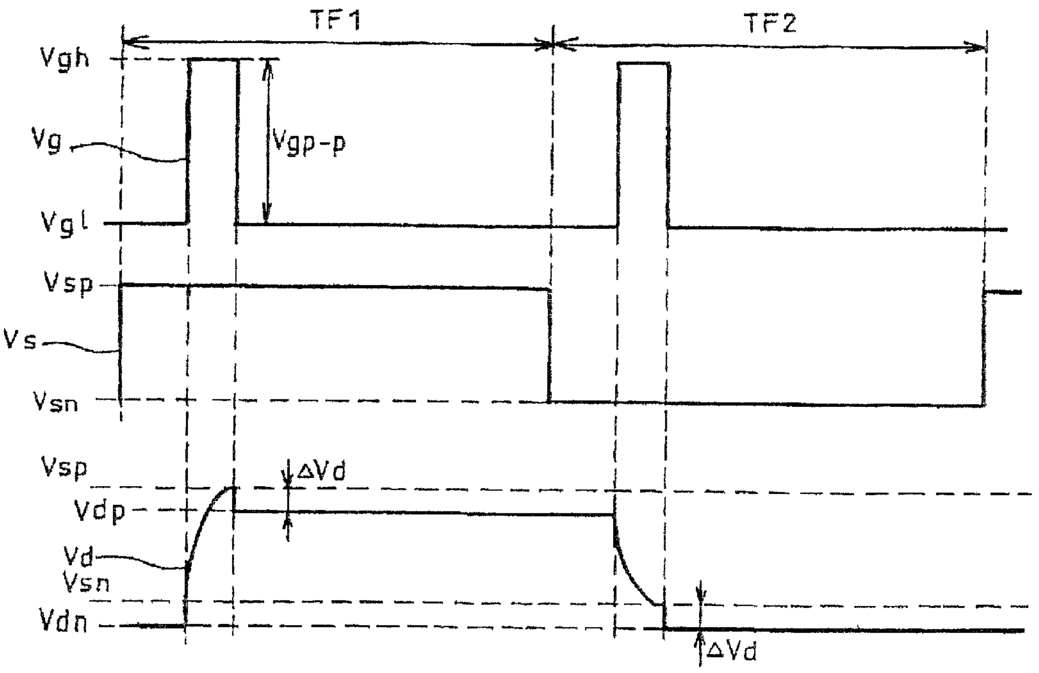
FIG. 10 (Prior Art)
FIG. 10 is a waveform chart showing a waveform generated by a conventional liquid crystal display
Figure 11:
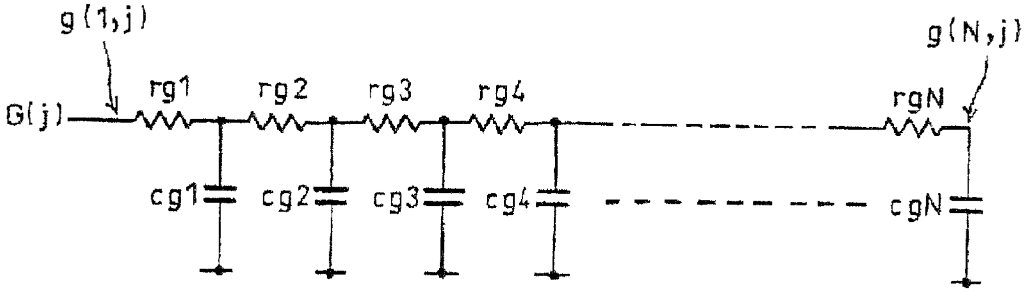
FIG. 11 (Prior Art)
FIG. 11 is a propagation equivalent circuit for explanation on the signal propagation delay in one scan signal line G (j).
Figure 12:
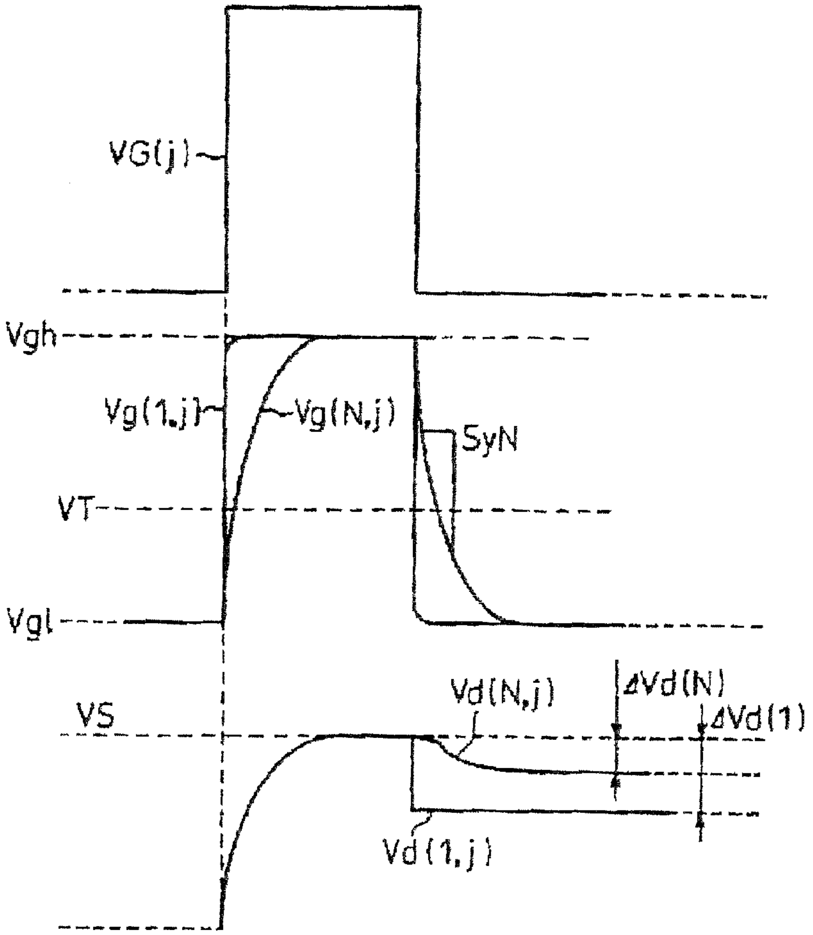
FIG. 12 (Prior Art)
FIG. 12 is a waveform chart showing how a scan signal VG (j) inputted from the scan signal line driving circuit 1315 to a scan signal line is rounded inside the panel due to the-mentioned characteristics of the signal propagation delay.

Lastly, an implementation of an image signal line driving circuit 200 and a scan signal line driving circuit 300 in the liquid crystal display device of the present invention is explained with reference to the accompanying drawings. FIG. 6 shows an implementation example; the image signal line driving circuit 200 and the scan signal line driving circuit 300 are implemented to an insulating substrate 100. FIG. 6 illustrates the insulating substrate 100, image signal line driving circuits 200-1 and 200-2, scan signal line driving circuits 300-1 to 300-3, flexible print substrates 700-1 to 700-2 and 800-1 to 800-3, and a hard substrates 750 and 850.

In the implementation example in FIG. 6, the image signal line driving circuits 200-1 and 200-2 and the scan signal line driving circuits 300-1 to 300-3 comprise each individual semi-conductor chip. The hard substrate 750, for example, is made of resin, and a circuit is formed on the surface. Each flexible print substrate 700-1 and 700-2 is made of a flexible material and a circuit is formed thereon. On the surface of the flexible print substrate 700-1, the image signal line driving circuit 200-1 is implemented. One end of the flexible substrate 700-1 is implemented to the hard substrate, and the other end of the flexible print 700-2 is implemented to the insulating substrate 100, which allows exchanging signals among circuits in the hard substrate 750, the image signal line driving circuit 200-1, and circuits in the insulating substrate 100. As for the flexible print substrate 700-2, the explanation is omitted because it is same as the flexible print 700-1.

The hard substrate 850 is made of resin, for example, and a circuit is formed on the surface. The flexible print substrates 800-1 to 800-3 are made of a flexible material, and circuits are formed. On the surface of the flexible print substrate 800-1, the scan signal line driving circuit 300-1 is formed. One end of the flexible print substrate 800-1 is mounted onto the hard substrate, and the other end of the flexible print substrate 800-2 is mounted to the insulating substrate 100, which allows exchanging signals among the circuits in the hard substrate 850, the scan signal line driving circuit 300-1, and the circuit in the insulating substrate 100. The explanations of flexible print substrates 800-1 and 800-2 are omitted because both are same as the flexible print 800-1.

The explanation of the structure of the signal wiring 305 in the liquid crystal display device comprising the image signal line driving circuits 200-1 and 200-2 and the scan signal line driving circuits 300-1 to 300-3 is as follows. The wiring signal 305 is a wiring connecting the flexible print substrates 800-1 to 800-3, and it is arranged in each flexible print substrate 800-1 to 800-3 and is connecting to one another on the surface of the hard substrate 850.

In the implementation example, the image signal line drivers 200-1 and 200-2 and the scan signal line driving circuits 300-1 to 300-3 are mounted on each flexible print substrate 700-1 and 700-2 and 800-1 to 800-3 respectively. However, it is not the only way to mount the image signal line driving circuits 200-1 and 200-2 and the scan signal line driving circuits 300-1 to 300-3. For example, the image signal line driving circuits 200-1 and 200-2 and the scan signal line driving circuits 300-1 to 300-3 may be mounted to the insulating substrate 100 in COG (Chip On Glass) or in monolithic. When the scan signal line driving circuits 300-1 to 300-3 are mounted in monolithic or in COG, the scan signal line driving circuits 300-1 to 300-3 are able to be connected to one another on the insulating substrate 100 through the signal wiring 305. In this case, the extra procedure to form the signal wiring 305 is not required because the signal wiring 305 can be formed by the same procedure of forming the scan signal line G and the image signal line S in the insulating substrate 100.

Industrial Applicability

An object of the present invention is to improve the display quality in display devices having a plurality of the scan signal line driving circuits. The present invention is useful for the liquid crystal display devices having such as a thin film transistor in each pixel as a switching element.

The invention claimed is:

1. A display device comprising:

a plurality of scan signal lines, a plurality of image signal lines, a plurality of scan signal line driving circuits for generating scan signals for driving the scan signal lines, wherein:

each scan signal line driving circuit internally generate a driving signal whose waveform changes in its such potential in such a manner that the potential decreases with a slope from a high potential to an intermediate potential between the high potential and a low potential and then increases from the intermediate potential to the high potential, the display device further comprises a signal wiring for connecting the scan signal line driving circuits with each other, the signal wiring having a potential equal to that of the driving signal; and each scan signal line driving circuit comprising: a driving signal circuit for generating the driving signal according to a signal with the high potential; a scan signal generation circuit generating the scan signal according to the driving signal generated by the driving signal generation circuit; and an internal wiring for transmitting the driving signal from the driving signal generation circuit to the scan signal generation circuit, each internal wiring being connected with one another by the signal wiring.

2. The display device of claim 1, wherein the driving signal has the waveform per cycle, the waveform changing in potential per cycle in such a manner that the potential decreases with a slope from the high potential to the intermediate potential between the high potential and a low potential and then increases from the intermediate potential to the high potential.

3. The display device of claim 2, wherein the scan signal line driving circuit receives a periodic signal having one pulse per the cycle.

4. The display device of claim 3, wherein the periodic signal is such that a length of a non-pulse period in one cycle is equal to a length of the slope from the high potential to the intermediate potential between the high potential and the low potential.

5. The display device of claim 3, wherein the periodic signal is fed into the scan signal line driving circuit in order to create the potential decrease with the slope from the high potential to the intermediate potential between the high potential and a low potential.

6. The display device of claim 1, wherein the potential change of the driving signal to decease the potential from the high potential to the intermediate potential with the slope partially slopes a potential change from a high potential to a low potential in the scan signals.

7. The display device of claim 1, wherein the potential of the scan signal lines is an averaged potential of the driving signals generated by the scan signal line driving circuits.

8. A display devices having a plurality of scan signal line driving circuits for driving scan signal lines by outputting scan signals to scan signal lines by using a received gate ON voltage and gate OFF voltage, wherein:

each scan signal line driving circuit includes:

a modulation section which modulates the gate ON voltage and outputs a modulated voltage thus prepared;

a scan signal line driving circuit which outputs either the modulated voltage supplied from the modulation section or the gate OFF voltage to the scan signal line respectively, output terminals of the modulation sections of the scan signal line driving circuits are connected with each other;

an internal wiring for transmitting the output voltage from the modulation section to the scan signal line driving section; and a signal wiring for connecting each internal wiring with one another, the signal wiring having a potential equal to that of the output voltage from the modulation section.

* * * * *